(12) United States Patent
DeFlandre et al.

(10) Patent No.: US 6,356,162 B1
(45) Date of Patent: Mar. 12, 2002

(54) IMPEDANCE COMPENSATION FOR A CABLE AND CONNECTOR

(75) Inventors: Yves DeFlandre, Pierrefonds; Marc Hoffman, Montreal; Gary Cyr, Sherbrooks, all of (CA)

(73) Assignee: Nordx/CDT, Inc., Quebec (CA)

( * ) Notice: Subject to any disclaimer, the term of this patent is extended or adjusted under 35 U.S.C. 154(b) by 0 days.

(21) Appl. No.: 09/286,113

(22) Filed: Apr. 2, 1999

(51) Int. Cl.[7] .............................. H01P 5/00; H03H 5/00
(52) U.S. Cl. .......................... 333/4; 333/24 R; 333/260
(58) Field of Search .......................... 333/4, 24 R, 260, 333/12, 1; 439/68–70

(56) References Cited

U.S. PATENT DOCUMENTS

| | | | |
|---|---|---|---|
| 3,022,472 A | * 2/1962 | Tanenbaum et al. | 333/18 |
| 4,853,659 A | * 8/1989 | Kling | 333/184 |
| 5,282,754 A | 2/1994 | Kish et al. | 439/108 |
| 5,326,284 A | 7/1994 | Bohbot et al. | 439/676 |
| 5,350,324 A | * 9/1994 | Guilbert | 439/894 |
| 5,358,414 A | 10/1994 | Kish et al. | 439/108 |
| 5,779,503 A | 7/1998 | Tremblay et al. | 439/676 |
| 6,089,923 A | * 7/2000 | Phommachanh | 439/676 |

* cited by examiner

Primary Examiner—Robert Pascal
Assistant Examiner—Kimberly E Glenn
(74) Attorney, Agent, or Firm—Wolf, Greenfield & Sacks, P.C.

(57) ABSTRACT

In an interconnection system including a cable and connectors, compensation is provided for stray reactances found in the connector elements. The connector elements may be RJ-style connector plug and jack pairs, which exhibit characteristic capacitive and inductive properties. The compensation is capacitive and/or inductive elements formed in the cable, components of the connectors, or an external printed wiring board. A double π-network is the preferred circuit topology for the compensated system.

31 Claims, 8 Drawing Sheets

IMPEDANCE COMPENSATION FOR A CABLE AND CONNECTOR

BACKGROUND

1. Field of the Invention

The present invention is in the field of cable and connector components for high speed data communication. More particularly, the invention is in the field of cable and connector components in which stray reactances and cross talk are compensated for.

2. Related Art

High speed electronic communication systems wend their way throughout the landscape of our workplaces, having become a ubiquitous feature of a technological society. Telephone, computer and process control networks, local area networks (LANs), wide area networks (WANs) and the Internet, and others form the backbone of modem communication. These networks and communication systems are generally referred to hereinafter as "interconnect systems." As society seeks to send more and more data through the wires constituting these interconnect systems, data rates, the quantity of information a given wire carries in a given period of time, have been pushed higher and higher. Since the quantity of information carried as an electronic signal increases as the frequency of the electronic signal increases, all else being equal, cables for use in modern, high speed interconnect systems are designed to carry very high frequency signals, e.g. 500 MHZ, without significant cross-talk or insertion loss over useful distances, e.g. hundreds or thousands of feet.

Modern offices and factories are flexible frameworks. Spaces mutate and evolve into different uses over time, necessitating rewiring portions of the various interconnect systems used. Some cable may remain permanently installed in the walls of a building, while other cables are moved from one portion of an interconnect system to another when the system is reconfigured. Consider, for example, the cable which connects your telephone instrument to the wall jack. When you move the telephone from one room to another, you generally bring that cable with the phone. To make such flexibility possible, the cable and telephone network employ a connector system including the wall jack and a plug on the cable. For purposes of the remaining discussion, a "connector system" includes a plurality of "connectors" by which one cable or component of a system can be releasably connected for electrical communication with another. Connectors include jacks or receptacles and plugs. A connection is formed by the conductive elements of a connector system when the connectors are mated, for example when a plug is inserted into a jack.

Electrical signal connectors include, generally, a body and one or more conductive, signal carrying elements. The body may include an insulating portion which supports and protects the signal carrying elements apart from each other. The entire connector may be surrounded, optionally, by a conductive shield. The signal carrying elements include, generally, two or three portions: a contact portion, a terminal portion and optionally a connecting portion therebetween. When a connecting portion is not used, the terminal portion and the contact portion are directly connected or integral with each other.

There are a number of popular modular, multi-position connectors, including those commonly referred to as RJ-style connectors, used in both telecommunications applications and high speed data communications applications. Among the more popular configurations are 4-conductor, 6-conductor and 8-conductor types, commonly (and sometimes erroneously) referred to as RJ-22, RJ-11 and RJ-45 types, respectively. For ease of description, without loss of generality, all such multi-position connectors are referred to herein below as an 8-conductor high speed communications connector. However, more or fewer conductors, and other configurations can be used, as will be evident to those skilled in the art.

In the case of an 8-conductor high speed communications type connector, the body is generally a solid, one or two-piece plastic unit, surrounding and supporting the signal carrying elements. When constructed using lead frame technology, the signal carrying elements are stamped out of one or more sheets of thin metal. The contact portion has a blade shape in the case of an 8-conductor high speed communications plug and has a wire spring shape in the case of an 8-conductor high speed communications jack. The terminal portion may be shaped for any one of several suitable termination methods. For example, the terminal portion may be shaped as a spike, tube, wire, etc., for termination by insulation displacement (i.e., piercing), soldering or crimping, printed wiring board (PWB) attachment, etc., respectively. Conventionally, the connecting portion, if used, is simply a wire or similar conductor connecting the contact portion to the terminal portion.

Cables for transmitting high speed digital signals frequently make use of balanced differential twisted pair transmission line technology, as explained above, because balanced differential pair transmission lines avoid some types of crosstalk and other interference, i.e., noise. Balanced differential twisted pairs are referred to hereinafter as twisted pairs. Information is transmitted over a twisted pair as electrical signals. In a twisted pair, each wire of the pair carries an information signal which is equal in amplitude and 180° out of phase with the other. That is, the signals are equal and opposite, referred to hereinafter as differential signals. Ideally, the proximity of the wires of a twisted pair to each other causes crosstalk and noise to affect both wires of the pair equally. Thus, crosstalk and noise ideally appear in both wires of the twisted pair in equal amplitudes and 0° out of phase with each other, referred to hereinafter as a common mode signal. Receivers for use with such cables detect differential signals, while substantially rejecting common mode signals. However, there are sources of differential noise, even in a well-balanced twisted pair transmission line.

Connector elements include asymmetrical parasitic reactances which are a principle source of differential noise due to coupling. The following discussion focuses on the parasitic reactances included in RJ-style connectors, such as the 8-conductor high speed communications, 8-position connector commonly used in North America for data communication networks, although the principles of the present invention are not limited in applicability to either the 8-conductor high speed communications connector specifically or the RJ-style connectors generally. In RJ-style connectors, as shown in FIG. 1, the plug 101 includes a plurality of flat, blade-shaped terminals 103 which mate with a corresponding plurality of bent spring terminals 107 included in the jack 109. The blade-shaped terminals exhibit significant capacitive coupling, while the spring terminals exhibit significant inductive coupling.

In the body of a multi-pair cable, each wire of each pair is affected substantially equally by adjacent wires because the pair is twisted. However, when a multi-pair cable is terminated at an RJ-style plug or jack, the twisted pairs are untwisted and flattened out into a linear arrangement. Thus, some wires are adjacent wires of unrelated pairs, over a significant length. This gives rise to coupling between adjacent wires from different pairs, with an interfering signal introduced into one wire of a pair, but not into the other—differential noise.

SUMMARY OF THE INVENTION

The present invention provides an improved interconnect system including a cable and connectors.

In an interconnect system according to aspects of the present invention, including a communications cable of balanced pairs of conductors, a plug and a jack, wherein one or more of the cable, the plug and the jack include a stray, reactance, the system further includes a compensating reactance built into another one or more of the cable, the plug and the jack. The compensating reactance may further comprise a π-network connected in one conductor of a first pair of conductors. In at least some embodiments, the compensating reactance corrects for both near end cross-talk and far end cross-talk. According to some embodiments using the π-network, the π-network includes components having values which when combined with the stray reactances form a symmetrically arranged network comprising: a central capacitor having a value 2C and having one side connected to a first conductor of a second pair of conductors; a pair of inductors, one of the pair of inductors being a stray inductor inherent in the interconnect system, each having a value L and connected in series with each other at a central node and each also having an end node, the central capacitor having another side connected to the central node; and a pair of end capacitors, one of the pair of end capacitors being a stray capacitor inherent in the interconnect system, each having a value C and connected from the end node of each of the pair of inductors to a second conductor of the second pair of conductors. This arrangement may also include a second symmetrical network arranged to form a balanced circuit.

A more particular embodiment of the invention includes the features described above incorporated into a lead frame structure built into the jack. The lead frame comprises: a first pair of signal conductors defining the central capacitor; a signal conductor defining one of the pair of inductors; and a second pair of signal conductors defining one of the pair of end capacitors.

Alternatively, the jack can be mounted on a printed wiring board, comprising a first inductive printed wiring trace in one layer of the printed wiring board. This embodiment can incorporate any of the above-described features in the printed wiring board. Moreover, when the cable includes balanced pairs of wires a-b and c-d, wherein a stray mutual inductance exists between wires a and c, and the mutual inductance formed by the first and second inductive printed wiring traces is between wires a and d. In this case, the second inductive trace also forms a π-network which includes components having values which when combined with the stray reactances form a symmetrically arranged network. That network comprises: a central capacitor having a value 2C and having one side connected to the second conductor of the second pair of conductors; a pair of inductors, one of the pair of inductors being a stray inductor inherent in the interconnect system, each having a value L and connected in series with each other at a central node and each also having an end node, the central capacitor having another side connected to the central node; and a pair of end capacitors, one of the pair of end capacitors being a stray capacitor inherent in the interconnect system, each having a value C and connected from the end node of each of the pair of inductors to the first conductor of the second pair of conductors.

The apparatus described above can include balanced pairs of conductors a-b and c-d and the plug can introduce a stray capacitance between conductors a and c having a value C and the jack can introduce a stray mutual inductance between conductors a and c having a value L. In this apparatus, the compensation reactance can comprise: a capacitor having a value 2C connected from conductor b to conductor c; a mutual inductor having a value L linking conductors a and c with a polarity opposite that of the stray mutual inductance; and a capacitor having a value C connected from conductor a to conductor c. This can be embodied in a lead frame structure built into the jack. The lead frame can comprise a first pair of signal conductors defining the capacitor of value 2C; a second pair of signal conductors defining the mutual inductor of value L; and a third pair of signal conductors defining the capacitor of value C.

In any of the above described embodiments, wherein the cable includes balanced pairs of wires a-b and c-d, and wherein a stray capacitance exists between wires a and c, the compensating reactance can be formed by a twist formed in a portion of the cable within the plug. The twist can introduce a compensating capacitance. Alternatively, the twist can introduce a compensating inductance. The twist may be between wire a and d. Likewise, wherein a stray capacitance exists between wires b and d, the compensating reactance can also be formed by a twist in a portion of the cable within the plug. The twist can introduce a compensating capacitance. Alternatively, the twist can introduce a compensating inductance. The twist may be between wire b and c.

In accordance with yet another aspect of the invention, embodiments may comprise a multi layer lead frame structure whose signal conductors comprise compensating capacitive and inductive structures. The capacitive structures may comprise: a first signal conductor; and a second signal conductor; the first and second signal conductors juxtaposed in space to exhibit a substantially capacitive reactance. The inductive structures may comprise a first signal conductor exhibiting a substantially inductive reactance. The inductive structures may further comprise a second signal conductor juxtaposed in space with the first signal conductor so the first and second signal conductors exhibit a mutual inductance therebetween. There may also be a second symmetrical network arranged to form a balanced circuit.

Finally, any of the above described embodiments may include a switch selectively connecting at least one reactive compensating element into the system.

BRIEF DESCRIPTION OF THE DRAWINGS

Embodiments of the invention are illustrated in the accompanying drawings, in which like reference designations indicate like elements, and in which.

DETAILED DESCRIPTION

The present invention will be better understood upon reading the following detailed description of embodiments thereof, in connection with the accompanying drawings.

For the purposes of the following discussion, the design of a multiple-pair twisted pair cable is assumed to yield a cable having negligible inherent cross talk, return loss, passive loss, etc. over the range of useful operating frequencies. The assumption simplifies the analysis and reasoning presented, however, the invention is not so limited, being applicable to less ideal cables, as well.

In general, embodiments of the present invention include features which introduce reactances into a cable, plug or jack, which compensate for stray or parasitic reactances causing unbalanced behavior relative to cross talk or noise immunity. In order to simplify meeting cross talk and impedance matching requirements over a wide frequency range, stray capacitance should preferably be compensated by a compensating capacitance, while stray inductance should preferably be compensated by a compensating inductance.

Circuits which are preferred should reduce both near-end cross talk (NEXT) and far-end cross talk (FEXT), as explained below. NEXT is defined as the cross talk measured by injecting a signal into a first end of a first twisted pair of a cable and measuring the cross talk returned at the first end of a second twisted pair of the cable. In contrast, FEXT is defined as the cross talk measured by injecting a signal into a first end of a first twisted pair of a cable and measuring the cross talk returned at a second end of a second twisted pair of the cable. One such circuit is a π network which when combined with the stray or parasitic forms a double-π network. Circuits such as described can be formed by combinations including one or more inductive loops in the cable, connector components or a printed wiring board (PWB) or one or more capacitive plates in the connector components or PWB. Some specific example embodiments of such circuits are now described.

Figure 1:
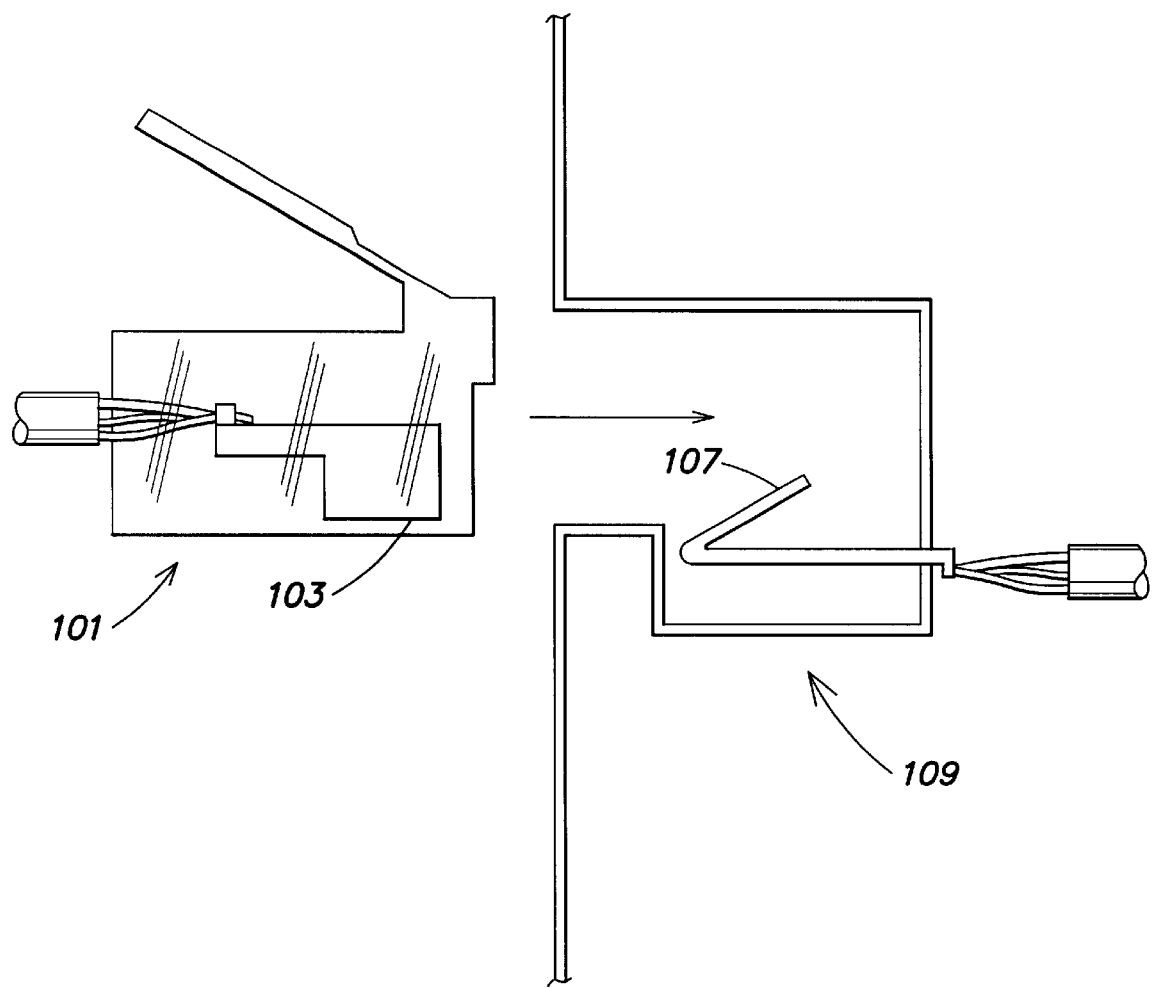
FIG. 1 is a cutaway side view of an RJ-style plug and jack.
Figure 2:
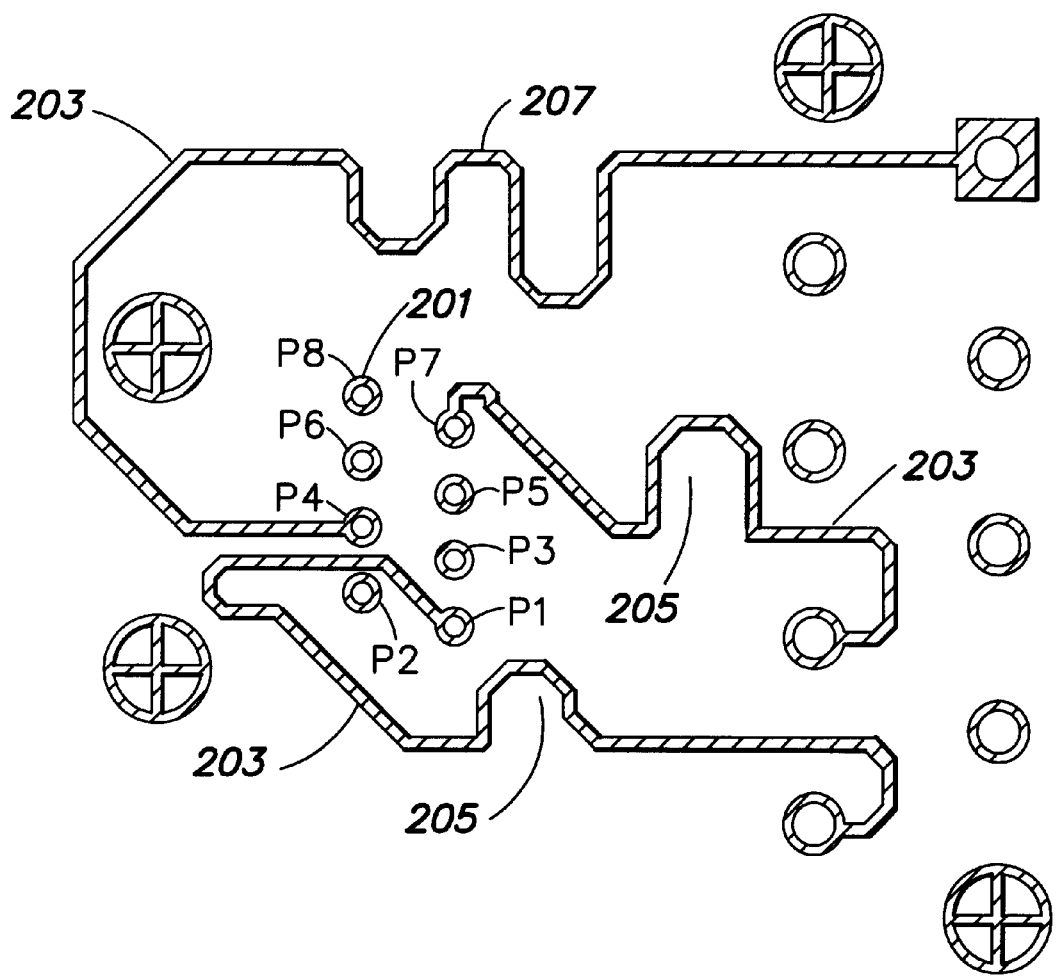
FIG. 2 is a plan view of one layer of a printed wiring board embodying aspects of the invention.
Figure 3:
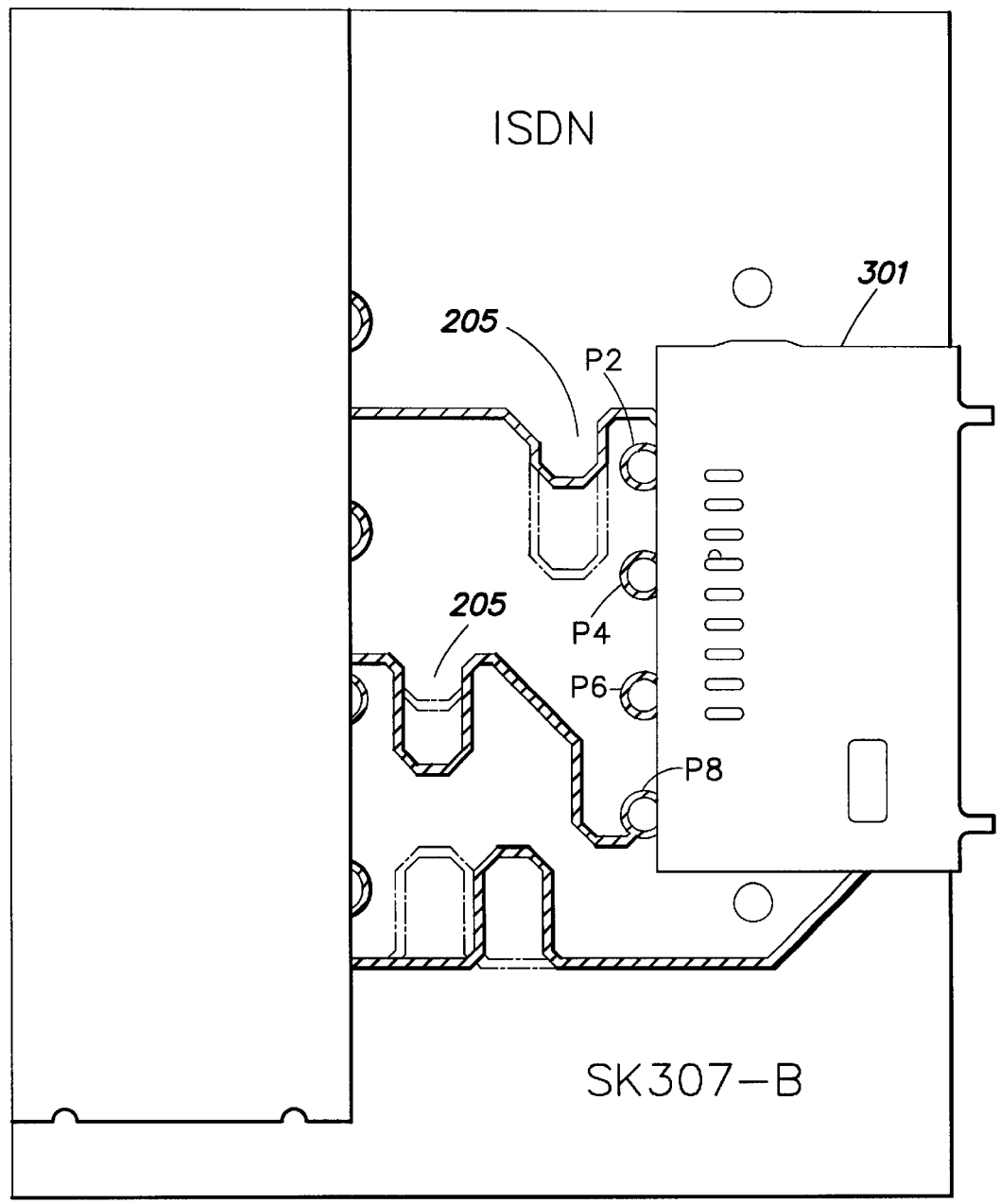
FIG. 3 is a plan view of a printed wiring board embodying aspects of the invention, showing multiple layers and placement of a jack.

FIG. 2 illustrates one layer of a PWB embodying aspects of the invention. The PWB illustrated includes multiple layers of wiring superposed on each other and separated from each other by dielectric layers. FIG. 3 illustrates a PWB in which two layers have been superposed, separated by a dielectric layer. As is conventional in layout drawings of this type, only the wiring layers are shown, conductors being indicated by black lines.

The major features of the PWBs of FIGS. 2 and 3 are now described in connection with two representative wiring layers. In the illustrated system, the communication network uses four twisted pairs of wire, the pairs denoted the a-b pair, the c-d pair, the e-f pair and the g-h pair. For simplicity, the a-b and c-d pairs are now considered.

The terminal portion of each signal carrying conductor of the jack is electrically connected to the PWB at circular conductor ends disposed on the PWB, called pads 201, which surround through- holes in the PWB. Each signal carrying conductor of the jack connects to a corresponding one of the pads. A conductive PWB trace 203 is connected to each pad 201. The a-b pair is terminated to pads P4 and P5, while the c-d pair is terminated to pads P3 and P6. The termination arrangement is selected to minimize cross-talk between the pairs by arranging the pairs so that cross-talk appears substantially as common-mode interference, as is known in the art. Cross-talk and termination impedance mis-match are further reduced according to one aspect of the invention by the arrangement of conductive PWB traces 203.

Each conductive PWB trace 203 may include in its path one or more flat loops 205 or serpentine regions 207, increasing the inductance of the trace 203. As discussed above in connection with the prior art, the signal carrying conductors of the jack, where contact portions are springs, cause a stray and undesired mutual inductance of value L to appear between conductors a and c. The interference signal introduced into conductor a by this stray mutual inductance can be removed from the a-b pair by coupling into conductor a an equal and opposite interference signal, such as that carried by conductor d. Therefore, the inductive elements of conductors a and d are placed on different layers of the PWB, in locations such that they exhibit a mutual inductance L. The directions of the loops are selected to couple into conductor a an equal and opposite interference signal to that coupled in from conductor c.

Figure 4:
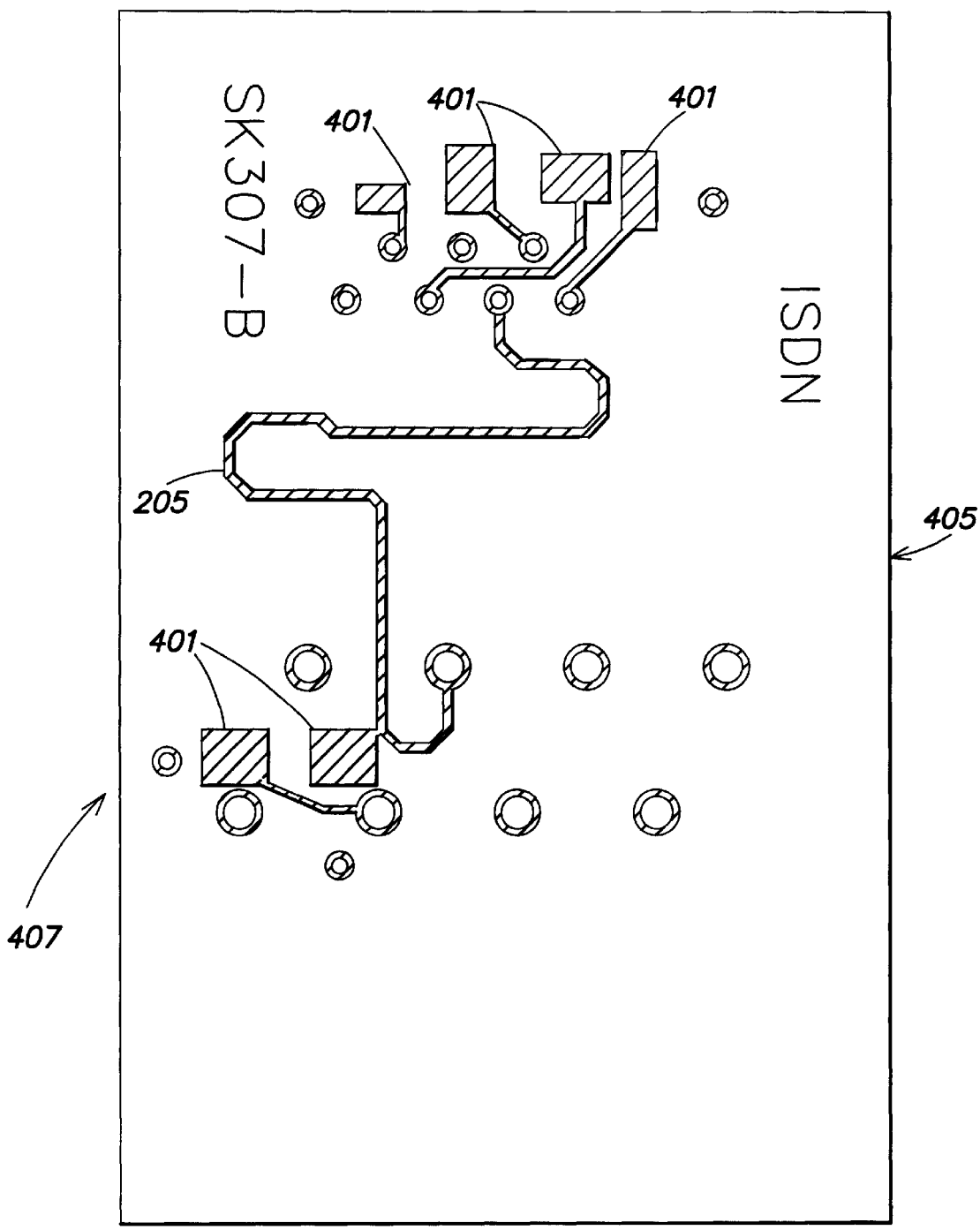
FIG. 4 is a plan view of a printed wiring board embodying aspects of the invention showing one layer thereof.

As shown in FIG. 3, overlaying loops 205 of same or different sizes creates different mutual inductances that may be desired. Several are illustrated in FIG. 3, which shows top layer traces as solid lines and lower layer traces as chain lines. Also shown is an 8-conductor high speed communications jack 301. Moreover, the described aspects of the invention can be combined with aspects of the invention in which capacitive compensation elements are used. In FIG. 4, capacitor plates 401 are shown connected to the traces of the PWB at both the end of the inductive loops 205 connected to the connector 405 and the end of the inductances to which other circuits or cables may be connected 407.

In RJ-style plugs, blade-shaped terminals capacitively couple signals between adjacent wires, resulting in a differential noise signal, similar to that which results from coupling caused by inductances, as discussed above. Also as above, capacitors can couple an equal and opposite compensating signal into the affected wires.

FIG. 4 illustrates the use of capacitive compensation on a PWB. As noted above, the capacitance can be introduced at either or both ends of any inductive compensation used.

Figure 5:
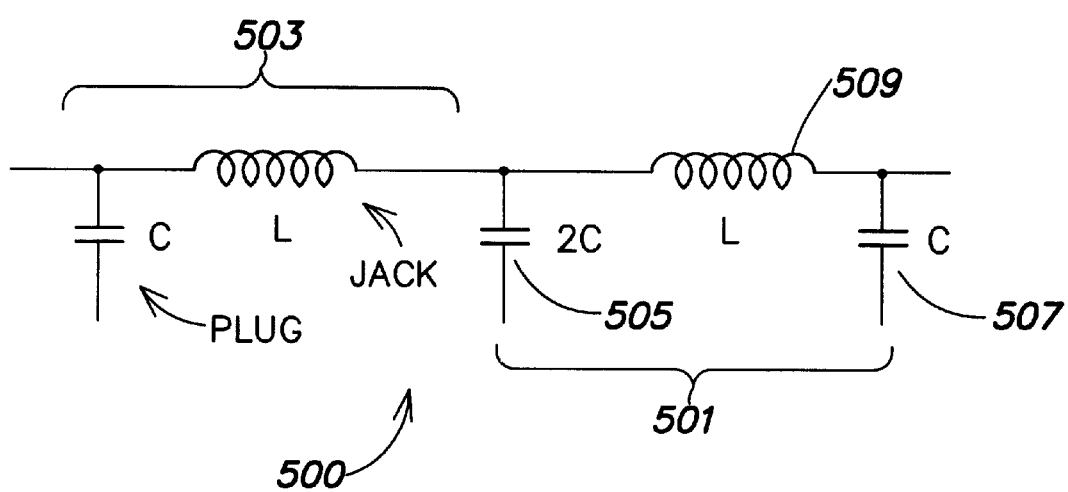
FIG. 5 is a circuit schematic showing the circuit relationship between stray and compensating reactances according to one aspect of the invention.

The basic elements described above can form more complex circuit topologies having particular desired properties. For example, FIG. 5 illustrates a basic double-π network 500. As illustrated, values of the compensating components 501 are selected to match the values of the stray or parasitic components 503. The plug, by virtue of including blade-like contacts introduces a capacitance C, whereas the jack, by virtue of including bent spring contacts introduces an inductance L. A central capacitor 505 of a value 2C and an end capacitor 507 of a value C balance stray capacitance C in the plug. An inductor 509 of a value L balances stray inductance L in the jack.

Figure 6:
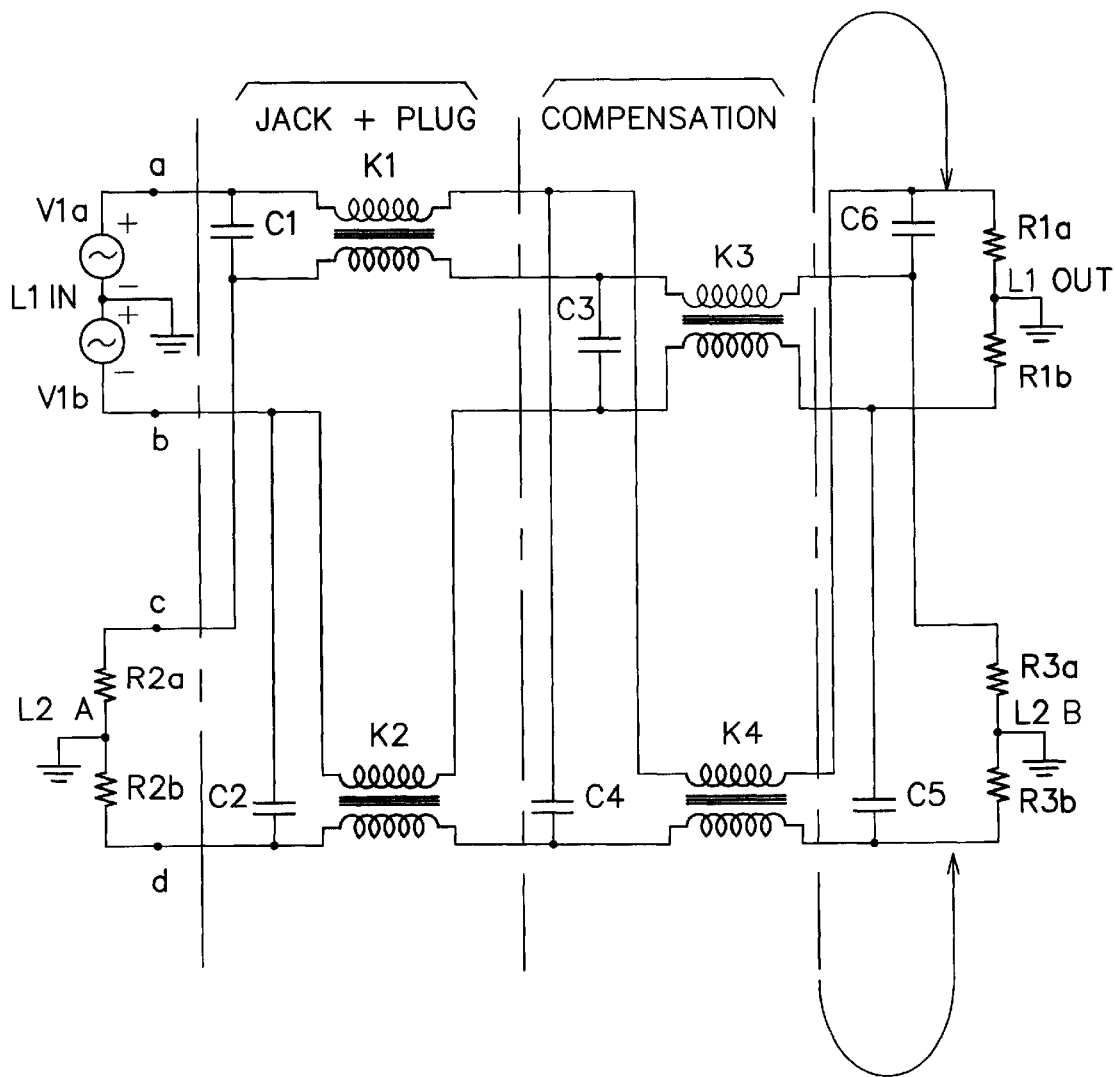
FIG. 6 is a circuit schematic showing an embodiment of the invention employing the principles illustrated by FIG. 5.

Making appropriate modification to take into account which wires are adjacent to which other wires in a conventional RJ-style plug or jack, the double-π network 500 compensates a multiple pair circuit as shown in FIG. 6. Moreover, the illustrated double-π circuit exhibits the desired properties of reducing both NEXT and FEXT when component values are set as shown.

In FIG. 6, stray reactances due to the plug and jack are shown as lumped components C1, C2, K1 and K2. Coupling through C1 between wires a and c is compensated by capacitances C4 and C6, while coupling through C2 between wires b and d is compensated by capacitors C3 and C5. In order to obtain the proper phase relationships between crosstalk coupled through the stray C1 and the compensating signal, C1 and C6 appear between wires a and c, while C4 appears between wires a and d. Similarly, C2 and C5 appear between wires b and d, while C3 appears between wires b and c. In like fashion, stray inductive coupling K1, between wires a and c is compensated by mutual inductance K4 between wires a and d, while stray conductive coupling K2, between wires b and d is compensated by mutual inductance K3, between wires b and c. The opposing relationship between stray reactance and compensation ensures that coupled signals are compensated with signals 180° out of phase with the coupled signals.

Inductive and capacitive coupling can be accomplished by other mechanical configurations, some of which are now discussed. These alternate mechanical configurations include modifications to the region between the cable and connector in which twisted pairs are untwisted into a linear adjacent relationship, as explained further below, and lead frames within the plug or jack connector components.

Figure 7A:
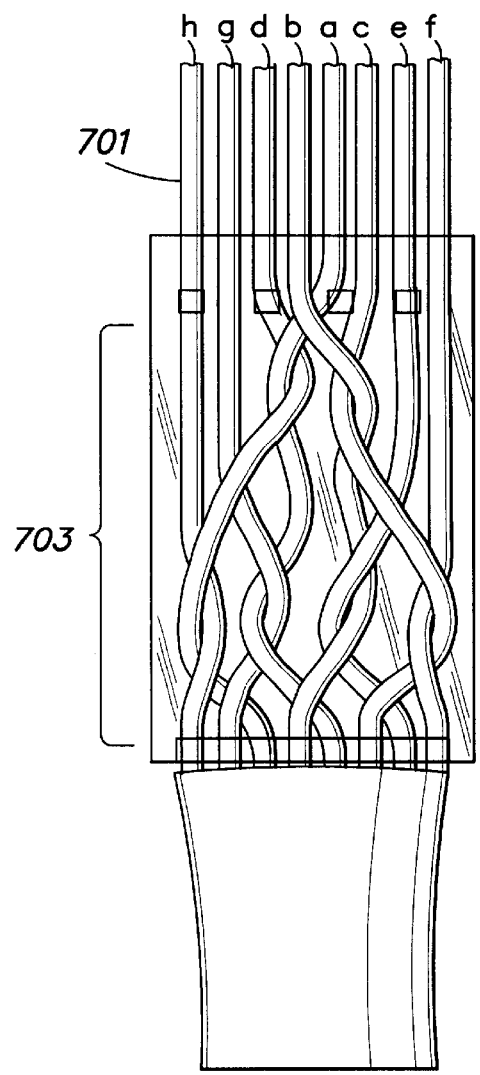
FIGS. 7A and 7B are top views of untwisted and retwisted cable ends prepared for termination in accordance with another aspect of the invention.
Figure 7B:
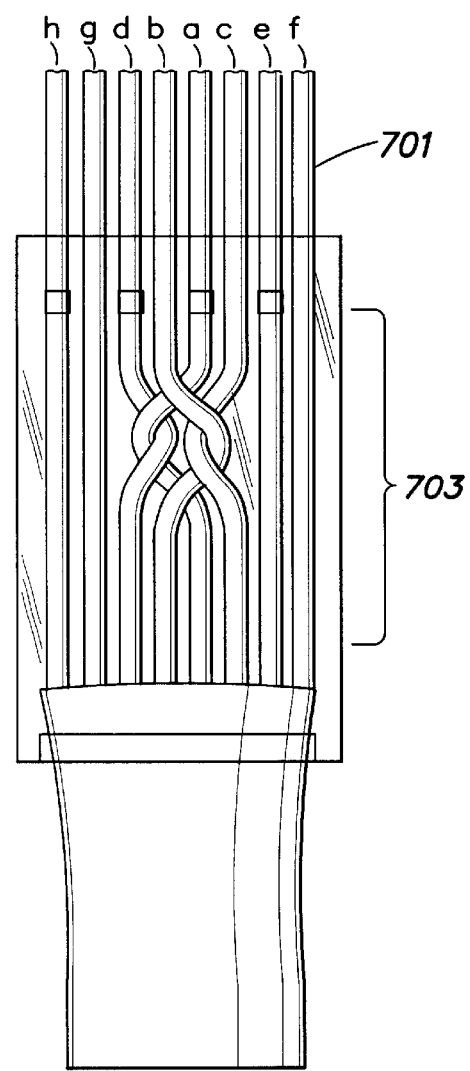

Another embodiment is now described in connection with FIGS. 7A and 7B, which illustrate applications of the invention to an unshielded twisted-pair cable prepared for termination at an 8-conductor high speed communications plug. This embodiment of the invention introduces capacitive compensation which effectively compensates for coupling of an interference signal from conductor c into conductor a. In this embodiment, the twisted pairs are untwisted 701 at the end of the cable to be terminated. However, new twists 703 are inserted between selected pairs of wire, as follows, between the body of the cable and the ends of the wires connected to the plug. Wire a is twisted with wire d and wire b is twisted with wire c. These twists 703 compensate for coupling which occurs between wires a and c and which also occurs between wires b and d. Additional twists are shown in region 703 of FIG. 7A which compensate pairs e-f and g-h, as well.

Figure 8A:
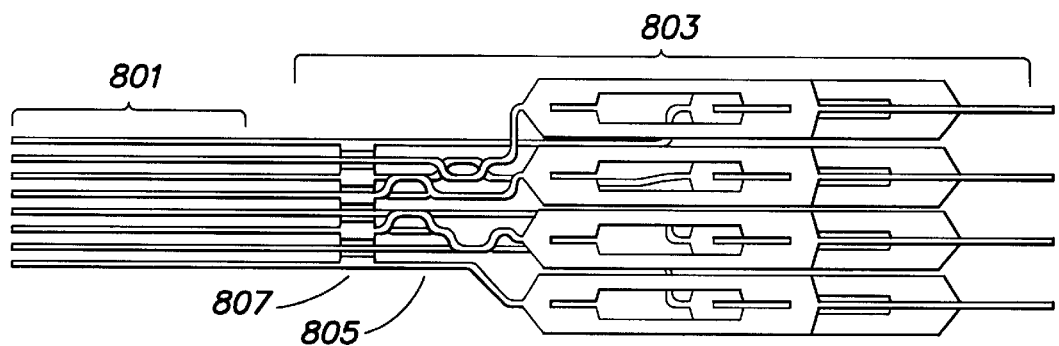
FIGS. 8A, 8B and 8C are top, side and perspective views of an embodiment of the invention made using lead frame technology.
Figure 8B:
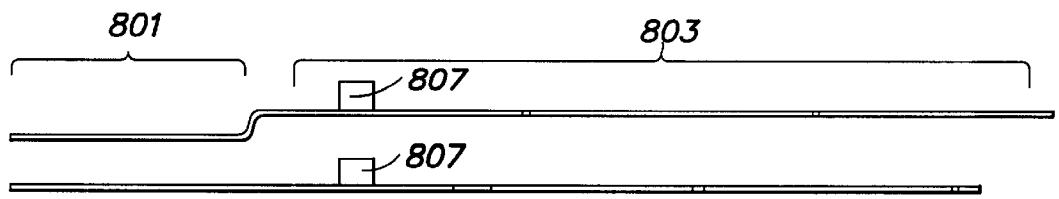
Figure 8C:
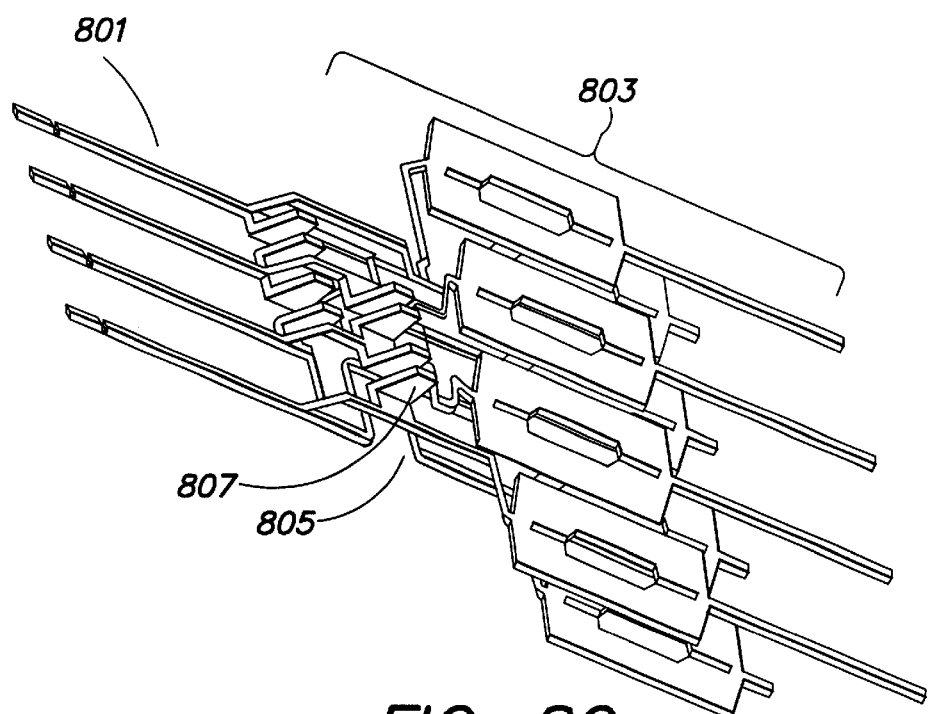

Yet another embodiment of the invention is described now, in connection with FIGS. 8A, 8B and 8C. In this embodiment of the invention, compensating components are incorporated entirely within an 8-conductor high speed communications type jack using a low-cost manufacturing technique. Some 8-conductor high speed communications jacks are made using lead frame technology to form both the contact elements 801 and signal conductors 803. Using this technology, compensation inductors 805 and capacitors 807 can be formed.

The present invention has now been illustrated by the foregoing description of embodiments thereof. Numerous variations contemplated should now be obvious to those skilled in the art. The invention is not limited to one of the embodiments shown, but rather is defined by the scope of the following claims when properly construed.

What is claimed is:

1. In an interconnect system including a communications cable of balanced pairs of conductors, a plug and a jack, wherein one or more of the cable, the plug and the jack include a stray reactance, apparatus comprising:
   a compensating reactance configured as π-network connected in one conductor of a first pair of conductors built into another one or more of the cable, the plug and the jack;
   wherein the compensating reactance corrects for both near end cross-talk and far end cross-talk.

2. The apparatus of claim 1, wherein the π-network includes components having values which when combined with the stray reactances form a symmetrically arranged network comprising:
   a central capacitor having a value 2C and having one side connected to a first conductor of a second pair of conductors;
   a pair of inductors, one of the pair of inductors being a stray inductor inherent in the interconnect system, each having a value L and connected in series with each other at a central node and each also having an end node, the central capacitor having another side connected to the central node; and
   a pair of end capacitors, one of the pair of end capacitors being a stray capacitor inherent in the interconnect system, each having a value C and connected from the end node of each of the pair of inductors a second conductor of the second pair of conductors.

3. The apparatus of claim 2, further comprising a second symmetrical network arranged to form a balanced circuit.

4. The apparatus of claim 3, wherein the jack is mounted on a printed wiring board, the printed wiring board further comprising:
   a first inductive printed wiring trace in one layer of the printed wiring board.

5. The apparatus of claim 4, further comprising:
   a second inductive printed wiring trace in another layer of the printed wiring board, the second printed wiring trace forming a mutual inductance with the first inductive printed wiring trace.

6. The apparatus of claim 5, wherein the cable includes balanced pairs of wires a-b and c-d, wherein a stray mutual inductance exists between wires a and c, and the mutual inductance formed by the first and second inductive printed wiring traces is between wires a and d.

7. The apparatus of claim 6, wherein the second inductive trace forms a π-network which includes components having values which when combined with the stray reactances form a symmetrically arranged network comprising:
   a central capacitor having a value 2C and having one side connected to the second conductor of the second pair of conductors;
   a pair of inductors, one of the pair of inductors being a stray inductor inherent in the interconnect system, each having a value L and connected in series with each other at a central node and each also having an end node, the central capacitor having another side connected to the central node; and
   a pair of end capacitors, one of the pair of end capacitors being a stray capacitor inherent in the interconnect system, each having a value C and connected from the end node of each of the pair of inductors to the first conductor of the second pair of conductors.

8. The apparatus of claim 2, including a lead frame structure built into the jack, the lead frame comprising:
   a first pair of signal conductors defining the central capacitor;
   a signal conductor defining one of the pair of inductors; and
   a second pair of signal conductors defining one of the pair of end capacitors.

9. The apparatus of claim 8, further comprising a second symmetrical network arranged to form a balanced circuit.

10. The apparatus of claim 1 wherein the cable includes balanced pairs of wires a-b and c-d, wherein a stray capacitance exists between wires a and c, and the compensating reactance is formed by a twist formed in a portion of the cable within the plug.

11. The apparatus of claim 10, wherein the twist introduces a compensating capacitance.

12. The apparatus of claim 11, wherein the twist introduces a compensating inductance.

13. The apparatus of claim 12, wherein the twist is between wires a and d.

14. The apparatus of claim 10, wherein a stray capacitance exists between wires b and d, and the compensating reactance is formed by a twist in a portion of the cable within the plug.

15. The apparatus of claim 14, wherein the twist introduces a compensating capacitance.

16. The apparatus of claim 15, wherein the twist introduces a compensating inductance.

17. The apparatus of claim 16, wherein the twist is between wires b and c.

18. In an interconnect system including a communications cable of balanced pairs of conductors, a plug and a jack, wherein one or more of the cable, the plug and the jack include a stray reactance, apparatus comprising:
   a compensating reactance built into another one or more of the cable, the plug and the jack; and
   a printed wiring board on which the jack is mounted, the printed wiring board including a first inductive printed wiring trace in one layer of the printed wiring board;
   wherein the compensating reactance further comprises π-network connected in one conductor of a first pair of conductors; and
   wherein the compensating reactance corrects for both near end cross-talk and far end cross-talk.

19. The apparatus of claim 18, wherein the π-network includes components having values which when combined with the stray reactances form a symmetrically arranged network comprising:
   a central capacitor having a value 2C and having one side connected to a first conductor of a second pair of conductors;
   a pair of inductors, one of the pair of inductors being a stray inductor inherent in the interconnect system, each having a value L and connected in series with each other at a central node and each also having an end node, the central capacitor having another side connected to the central node; and
   a pair of end capacitors, one of the pair of end capacitors being a stray capacitor inherent in the interconnect system, each having a value C and connected from the end node of each of the pair of inductors to a second conductor of the second pair of conductors.

20. The apparatus of claim 19, further comprising:
   a second inductive printed wiring trace in another layer of the printed wiring board, the second printed wiring trace forming a mutual inductance with the first inductive printed wiring trace.

21. The apparatus of claim 20, wherein the cable includes balanced pairs of wires a-b and c-d, wherein a stray mutual inductance exists between wires a and c, and the mutual inductance formed by the first and second inductive printed wiring traces is between wires a and d.

22. The apparatus of claim 21, wherein the second inductive trace forms a π-network which includes components having values which when combined with the stray reactances form a symmetrically arranged network comprising:
   a central capacitor having a value 2C and having one side connected to the second conductor of the second pair of conductors;
   a pair of inductors, one of the pair of inductors being a stray inductor inherent in the interconnect system, each having a value L and connected in series with each other at a central node and each also having an end node, the central capacitor having another side connected to the central node; and
   a pair of end capacitors, one of the pair of end capacitors being a stray capacitor inherent in the interconnect system, each having a value C and connected from the end node of each of the pair of inductors to the first conductor of the second pair of conductors.

23. The apparatus of claim 18, wherein the cable comprises balanced pairs of conductors a-b and c-d, wherein a stray capacitance exists between conductors a and c, and the compensating reactance comprises a twist formed in a portion of the cable within the plug.

24. In an interconnect system including a communications cable of balanced pairs of conductors, a plug and a jack, wherein one or more of the cable, the plug and the jack include a stray reactance, apparatus comprising:
   a compensating reactance built into another one or more of the cable, the plug and the jack;
   wherein the apparatus includes balanced pairs of conductors a-b and c-d and the plug introduces a stray capacitance between conductors a and c having a value C and the jack introduces a stray mutual inductance between conductors a and c having a value L and the compensation reactance comprises:
      a capacitor having a value 2C connected from conductor b to conductor c;
      a mutual inductor having a value L linking conductors a and c with a polarity opposite that of the stray mutual inductance; and
      a capacitor having a value C connected from conductor a to conductor c.

25. The apparatus of claim 24, including a lead frame structure built into the jack, the lead frame comprising:
   a first pair of signal conductors defining the capacitor of value 2C;
   a second pair of signal conductors defining the mutual inductor of value L; and
   a third pair of signal conductors defining the capacitor of value C.

26. The apparatus of claim 24, wherein
   the capacitor connected from conductor b to conductor c is formed by a twist in conductors b and c; and
   the inductor linking conductors a and c and the capacitor connected between conductor a and conductor c are formed by a twist in conductors a and c.

27. In an interconnect system including a communications cable of balanced pairs of conductors, a plug and a jack, wherein one or more of the cable, the plug and the jack include a stray reactance, apparatus comprising:
   a compensating reactance built into another one or more of the cable, the plug and the jack;
   further comprising a multi layer lead frame structure whose signal conductors comprise compensating capacitive and inductive structures.

28. The apparatus of claim 27, wherein the capacitive structures comprise:
   a first signal conductor; and
   a second signal conductor;
   the first and second signal conductors juxtaposed in space to exhibit a substantially capacitive reactance.

29. The apparatus of claim 28, wherein the inductive structures comprise a first signal conductor exhibiting a substantially inductive reactance.

30. The apparatus of claim 29, wherein the inductive structures further comprise a second signal conductor juxtaposed in space with the first signal conductor so the first and second signal conductors exhibit a mutual inductance therebetween.

31. The apparatus of claim 30, further comprising a second symmetrical network arranged to form a balanced circuit.

* * * * *

UNITED STATES PATENT AND TRADEMARK OFFICE
CERTIFICATE OF CORRECTION

PATENT NO.   : 6,356,162 B1  
DATED        : March 12, 2002  
INVENTOR(S)  : Yves DeFlandre, Marc Hoffman and Gray Cyr It is certified that error appears in the above-identified patent and that said Letters Patent is hereby corrected as shown below:

Column 2,
Line 18, please replace "modem" with -- modern --.

Column 7,
Line 62, after the word "as" please insert -- a --.

Signed and Sealed this

Fourth Day of February, 2003

JAMES E. ROGAN  
*Director of the United States Patent and Trademark Office*